United States Patent [19]
Van Vaals

[11] Patent Number: 4,857,844
[45] Date of Patent: Aug. 15, 1989

[54] METHOD OF AND DEVICE FOR AUTOMATIC PHASE CORRECTION OF COMPLEX NMR SPECTRA

[75] Inventor: Johannes J. Van Vaals, Eindhoven, Netherlands

[73] Assignee: U.S. Philips Corporation, New York, N.Y.

[21] Appl. No.: 270,923

[22] Filed: Nov. 14, 1988

[30] Foreign Application Priority Data

Nov. 12, 1987 [NL] Netherlands .................. 8702701

[51] Int. Cl.$^4$ ............................................. G01R 33/20
[52] U.S. Cl. .................................... 324/307; 324/309
[58] Field of Search ............... 324/300, 307, 309, 311, 324/312, 313, 318, 322

[56] References Cited

U.S. PATENT DOCUMENTS

| 4,684,890 | 8/1987 | Briguet | 324/309 |
| 4,703,267 | 10/1987 | Maudsley | 324/309 |
| 4,766,377 | 8/1988 | Ohuchi | 324/309 |
| 4,766,380 | 8/1988 | Den Boef | 324/309 |

OTHER PUBLICATIONS

J. Daubenfield et al., Automatic Intensity, Phase and Baseline Corrections in Quantitative Carbon-13 Spectroscopy, Journal of Magnetic Resonance, vol. 62, pp. 195–208, 1985.
D. Shaw, Fourier Transform N.M.R. Spectroscopy, Elsevier, 1976, p. 33.
P. R. Luyten et al., 'H MR Spatially Resolved Spectroscopy of Human Tissues in Situ, Magnetic Resonance Imaging, vol. 4, pp. 237–239, 1986.

Primary Examiner—Michael J. Tokar
Attorney, Agent, or Firm—Thomas A. Briody; Jack E. Haken; Jack D. Slobod

[57] ABSTRACT

A method is proposed for the automatic correction of phase errors in NMR spectra. The phase errors are caused inter alia by deficiencies of the NMR hardware, by the shifted sampling of a magnetic resonance signal after the occurrence thereof. Phase correction is performed by determining first the modulus spectrum from a complex magnetic resonance spectrum, after which in the modulus spectrum there are determined, with discrimination of peaks which are below a given level, the peak parameters of the remaining peaks, such as peak amplitude, peak width at half amplitude and peak position, after which, using the peak parameters determined, a model of the complex spectrum is determined which does not contain phase errors, a phase distortion being subsequently introduced into this model until the phase of the model at the edges of the spectrum corresponds as well as possible to the phase at the edges of the complex spectrum, after which finally the complex spectrum is point-wise corrected with the phase distortion introduced. The proposed phase correction does not impose strict requirements as regards the modeling, because up to a given level variations in the modeling hardly influence the phase variation at the edge of the spectrum.

12 Claims, 1 Drawing Sheet

4,857,844

METHOD OF AND DEVICE FOR AUTOMATIC PHASE CORRECTION OF COMPLEX NMR SPECTRA

BACKGROUND OF THE INVENTION

1. Field of the Invention

The invention relates to a method of correcting the phase of a complex magnetic resonance spectrum obtained, using Fourier transformation, from sampling values of at least one resonance signal, which resonance signals are generated by means of RF electromagnetic pulses in an object which is situated in a steady, uniform magnetic field, a model of the complex magnetic resonance spectrum being formed by means of the magnetic resonance spectrum obtained, the phase being corrected on the base of the model.

The invention also relates to a device for determining a complex magnetic resonance spectrum of at least a part of an object, which device comprises means for generating a steady magnetic field, means for applying magnetic field gradients on the steady, uniform magnetic field, means for transmitting RF electromagnetic pulses in order to generate resonance signals in the object, means for receiving and detecting the resonance signals generated, and means for generating sampling values from the detected resonance signals, and also comprises programmed means for determining, using Fourier transformation, the complex magnetic resonance spectrum from the sampling values, which programmed means are also suitable for determining a model from the complex magnetic resonance spectrum.

2. Description of the Prior Art

A method of the kind is known from the article by J. Daubenfeld et al. in "Journal of Magnetic Resonance", Vol. 62, pp. 195–208, 1985. Said article describes an automatic phase correction for a complex magnetic resonance spectrum containing phase errors. The phase errors are caused inter alia by misadjustment of the detector and by instrumental deficiencies such as the use of non-ideal analog anti-aliasing filters and the waiting period required, after the application of the RF electromagnetic pulse, before the signal sampling of the magnetic resonance signal (FID signal) commences. In the complex spectrum obtained from the sampling values the phase errors occur as frequency-independent (zero-order) and frequency-dependent (higher-order) phase errors. The cited article proposes a method of recovering an absorption component from the complex magnetic resonance spectrum containing phase errors by means of automatic phase correction. A calibration curve for the phase is determined from phases of preferably three reference lines. When the phases of the reference lines are known, in the case of three reference lines a second-order phase polynomial (the calibration curve) is adapted thereto by means of a least-squares criterion. The coefficients of the phase polynomial are then defined, so that the spectrum can subsequently be point-wise corrected. The absorption component can be determined from the corrected spectrum (see formula 6 on page 199 of the cited article). The phases of the reference lines are determined on the basis of a parametric model of the waveform of the signal. This model contains a number of parameters of the resonance line, such as signal amplitude, resonance frequency, line width at half amplitude, and differential angle between the actual (unknown) phase and an approximative phase of the (unknown) actual phase. Using a least-squares optimization procedure, the model is adapted to (measured) data points of the complex magnetic resonance spectrum. The approximative phase is varied until, for example a minimum differential angle is reached. The approximative phase is then taken as the phase for the reference line. The described procedure is repeated for each reference line. The method described in the cited article has the drawback that the model parameters must be accurately determined. If the spectrum does not contain well-defined resonance lines which can serve as reference lines (in the case of non-defined resonance lines the model parameters cannot be determined with adequate accuracy), it will be necessary to add substances to the object which can serve as the reference in that they cause an acute resonance peak in the spectrum. In said article, for example an oil spectrum is measured whereto the reference substances TS $CCL_4$ and $CS_2$ have been added, which additions produce well-defined resonance lines in parts of the spectrum which are not of importance.

It is the object of the invention to provide a method which does not have the said drawbacks.

SUMMARY OF THE INVENTION

To achieve this, a method in accordance with the invention is characterized in that the model is formed by means of at least one peak of a modulus spectrum or of a power spectrum, which modul spectrum or power spectrum is determined from the complex magnetic resonance spectrum, for the determination of coefficients of a frequency-dependent phase function which extends across the complex spectrum a given phase shift being step-wise imparted to the model until the phase at edges of the complex spectrum approximates the phase at edges of the model in accordance with a predetermined criterion, after which the phase of the complex spectrum is corrected by means of the frequency-dependent phase function determined. The phase of all data points in the frequency domain can be corrected by means of the frequency-dependent phase function (point-wise correction). The frequency-dependent phase function is also suitable for correcting the phase in the peak locations and outside the peak locations according to a weighted phase from the phases of the peak locations. The degree of contribution of the peaks to a frequency outside the peak locations is determined on the basis of the model, which contribution is used to determine weighting factors for the weighted phase. Notably when the spectrum contains a very strong peak, for example a water peak in proton spectra, it may be necessary to use such a somewhat refined correction. The following is a further explanation of the formation of the model and of the method in accordance with the invention. From the measured complex magnetic resonance spectrum use is made of only peaks in the modulus or power spectrum formed therefrom which are sufficiently distinct from, for example noise. Therefrom peak parameters are determined for constructing the model. A model is formed which corresponds to a spectrum which is not disturbed by phase errors (ideal model). The phase of the model is varied in given steps, and at the edges of the spectrum it is fitted (for example, using a least-squares optimization procedure) to the frequency-dependent phase function; the simulated phase error is adapted as well as possible to the actual phase error. The method in accordance with the invention is based on the recognition of the fact that, then no resonance lines occur at the egdes of the spectrum, the phase at the edge is substantially independent of an accurate simulation of the spectrum. Therefore, in accordance with the invention no strict requirements need be imposed as regards the spectrum on which the formation of the module is based. The parameters of the resonance peaks need not be very accurately determined and overlapping resonance lines may also occur in the spectrum. If no sharp peaks occur in the spectrum, it is still not necessary to add reference substances in order to achieve accurate modeling. In general upon detection it will be necessary to choose the bandwidth to be slightly larger than the signal bandwidth (the spectrum of interest) in order to obtain edges in the spectrum which are free of resonance peaks. This need not lead to a worse signal-to-noise ratio when oversampling takes place which includes the edges; after that usually a digital filtering operation is performed in practice. Furthermore, in the case of a complex spectrum containing a substantial amount of noise, filtering may be required prior to the modeling. The peaks can then be more readily determined and less phase noise will occur at the edges of the spectrum.

A version of a method in accordance with the invention is characterized in that peak parameters are determined from peaks of the modulus spectrum or the power spectrum, Lorentzian lines being construed for the model from said parameters. In general Lorentzian lines can suitably describe the spectrum (model).

The invention will be described in detail hereinafter with reference to a drawing; therein

DETAILED DESCRIPTION OF THE PREFERRED EMBODIMENTS

Figure 1:
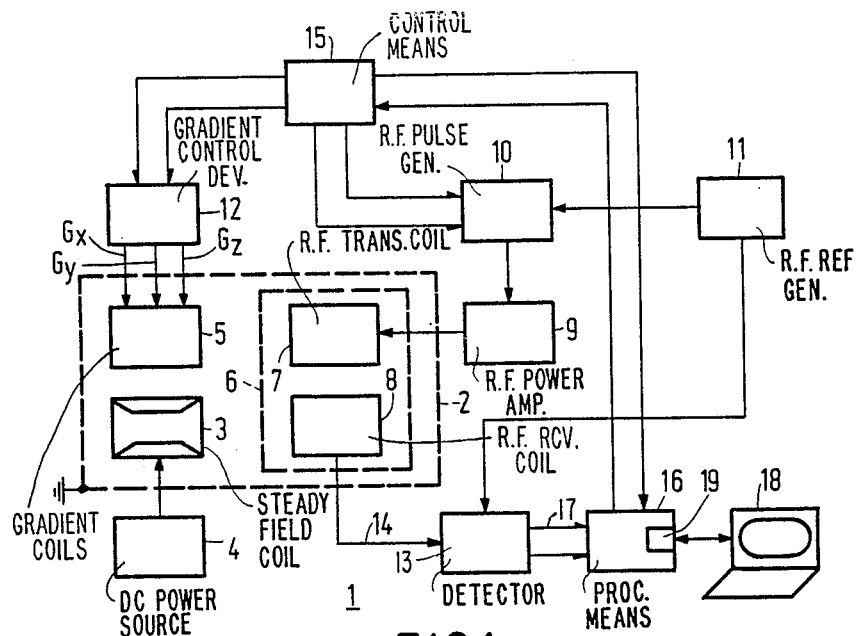
FIG. 1 diagrammatically shows a device in accordance with the invention.

FIG. 1 diagrammatically shows a device in accordance with the invention which comprises, arranged within a shielded space 2, magnet coils 3 for generating a steady, uniform magnetic field (the means for generating a steady magnetic field), gradient coils 5 (the means for applying magnetic field gradients), and a transmitter and receiver coil system 6, comprising a transmitter coil 7 and a receiver coil 8 (the means for transmission and reception). When the magnet coils 3 are formed by a resistance magnet, they are powered by a DC power supply source 4. When the magnet coils are formed by a permanent magnet, of course, the DC power supply source 4 is absent. The magnet coils 3 can also be formed by a superconducting magnet. The transmitter coil 7 is coupled to a reference generator 11 via an RF power amplifier 9 and an RF generator 10. The RF generator 10 serves to generate an RF electromagnetic pulse for excitation of nuclear spins in the object situated within the magnet coils 3. The gradient coils 5 are controlled by a gradient coil control device 12 and serve to generate magnetic field gradients which are superposed on the steady, uniform magnetic field. Generally three gradients will be generated; their field direction coincides with the direction of the steady, uniform magnetic field and their respective gradient directions z, y and x entend mutually perpendicularly. The receiver coil 8 serves to receive magnetic resonance signals of nuclear spins generated in the object by the transmitter coil 7 and is coupled to a detector 13 (the means for detection) for detecting the magnetic resonance signals 14 in quadrature detection. The detector 13 is coupled to the reference generator 11 and comprises low-pass filters and analog-to-digital converters (the means for generating sampling values) for digitizing the resonance signals received and detected. Control means 15 serve for the control and timing of the RF generator 10 and the gradient coil control device 12. The device 1 also comprises processing means 16 processing the digitized resonance signals 17. The processing means 16 are coupled to the control means 15. For the display of spectra formed by means of programmed means in the processing means 16, the processing means are also coupled to a display unit 18. The processing means 16 comprise a memory 19 for the storage of the programmed means and for the storage of the non-corrected and corrected spectra and other data formed by means of the programmed means. The processing means 16 are generally formed by a complex computer system comprising a variety of facilities for coupling to peripheral equipment.

Figure 2:
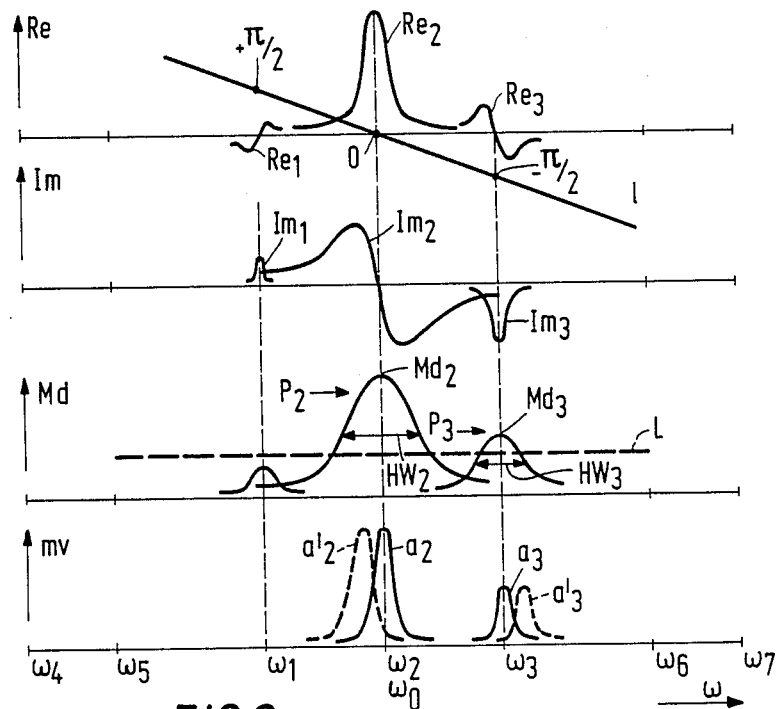
FIG. 2 shows a decomposition of a magnetic resonance spectrum, three resonance lines of which are shown.

FIG. 2 shows a decomposition of a complex magnetic resonance spectrum, three resonance lines of which are shown. The real part Re of the complex spectrum, the imaginary part Im of the complex spectrum, the modulus Md of the complex spectrum and a model mv, construed from the modulus Md, of the absorption component of the spectrum are shown as a function of the frequency $\omega$. An object (not shown) is arranged within the magnet coils 3 so as to be exposed to the steady, uniform magnetic field $B_0$ generated in the magnet coils. Under the influence of the field $B_0$ a small excess of nuclear spins present in the object will be directed in the direction of the field $B_0$. From a macroscopie point of view the small excess of nuclear pins directed in the direction of the field $B_0$ is considered as a magnetization M of the object or as a slight polarization of the nuclear spins present in the object. In a coordinate system which is stationary vis-à-vis an observer, the magnetization M performs a precessional motion about the magnetic field $B_0$: $\omega_0 = $ gamma.$B_0$, where gamma is the gyromagnetic ratio and $\omega_0$ is the resonance frequency of the nuclear spins. The object arranged in the magnetic field $B_0$ is subsequently exposed to an RF electromagnetic pulse generated in the transmitter coil 7 by the RF generator 10. The steady magnetic field $B_0$ defines a z-axis of an xyz cartesian coordinate system which rotates about the z-axis thereof at the angular frequency $\omega_0$ of the RF electro-magnetic pulse (a coordinate system rotating in the same direction). Nuclear spins having a Larmor frequency equal to the angular frequency $\omega_0$ will be synchronized with the rotating coordinate system. Before and after the application of the RF electro-magnetic pulse the magnetization M will be stationary in the rotating coordinate system. The rotation in the rotating coordinate system of the magnetization M will be proportional to the pulse duration and the pulse amplitude of the RF electromagnetic pulse. A component of the magnetization M projected onto the xy plane of the rotating coordinate system, being coincident with the x-axis, forms the dispersion component and a component which coincides with the y-axis of the rotating coordinate system forms the absorption component of the magnetization M (the latter holds good in the absence of phase errors). When the power of the applied RF electromagnetic pulse is so small that no saturation occurs, the description of the absorption component as a function of the frequency is in conformity with Lorentzian spectral line, a Fourier transform of an exponential function. The dispersion component is the associated component. The absorption line and the dispersion line are related to one another via a Hilbert transformation: dispersion line=absorption line ⊗ $(2\pi/\omega)$, in which ⊗ represents the convolution operation (for a detailed description of absorption and dispersion, see the manual: Fourier Transform N.M.R. Spectroscopy, D. Shaw, published by Elsevier, 1976, (page 33). The exponential function describes the decreasing of the magnetization M projected onto the xy plane (the so-called transverse magnetization). This generally known relaxation phenomenon is also described in said manual. The absorption line (being out of phase with respect to the excitation frequency) is of most interest to a spectroscopist: the absorption of energy by the system of nuclear spins (object), the behaviour of the magnetization as a function of the frequency. When the object contains not only for example water-bound protons (with which synchronization takes place) but also fat-bound protons which are present in a different chemical environment, a water and fat spectrum will be obtained after Fourier transformation of an NMR resonance signal. In the absorption spectrum thereof two (dominant) resonance lines occur. It will be evident that when the object also contains protons situated in other chemical environments, the spectrum will exhibit more resonance peaks. For example, when double phase-sensitive detection is used, in which case the detector 13 comprises a first phase-sensitive detector (not shown in detail) whereto the reference signal generated by means of the reference generator 11 is applied as a reference signal and a second phase-sensitive detector whereto the 90° phase-shifted reference signal is applied, after signal sampling by the analog-to-digital converters in the detector 13 the two digital signals 17 will become available wherefrom, using Fourier transformation, the absorption mode and the dispersion mode spectrum are determined in the processing means 16. The dispersion mode spectrum is to be considered as the real part of the transverse magnetization as a function of the frequency and the absorption mode spectrum as the imaginary part thereof (in the absence of phase errors). The NMR spectrum can be considered as the pulse response of the nuclear spin system (object). When phase errors occur in the NMR device 1, they will have an effect on the spectrum. FIG. 2 shows, by way of example, a spectrum containing phase errors. For the description of the method in accordance with the invention it is assumed that there are three resonance peaks at the frequencies $\omega_1$, $\omega_2$ and $\omega_3$. The reference generator 11 is tuned to $\omega_2$, so that $\omega_0=\omega_2$. For example, in the case of shifted measurement of the FID signal with respect to the RF electromagnetic pulse due to chemical shift, nuclear spins producing resonance at $\omega_1$ will give rise to phase error in the spectrum. The same holds for nuclear spins producing resonance at $\omega_3$. It is assumed that the phase error amounts to $+\pi/2$ in $\omega_1$ and $-\pi/2$ in $\omega_3$. The reference 1 denotes a linear function of the phase which extends through the measured phases in $\omega_1$, $\omega_2$ and $\omega_3$. A linear phase correction across the spectrum could be performed thereby (in this example it is assumed that there is no zero-order phase error). It may occur that the phase error does not extend linearly across the spectrum. It will be evident that the desired absorption component cannot be simply read from a spectrum containing phase errors. The resonance peak in $\omega_2$ ($Re_2$ and $Im_2$) can be described by means of a Lorentzian line. The resonance peaks in $\omega_1$ ($Re_1$ and $Im_1$) and in $\omega_3$ ($Re_3$ and $Im_3$) cannot be simply described by means of a Lorentzian line because of the phase error occurring therein. In accordance with the invention, from the real spectrum Re and the imaginary spectrum Im measured by means of the NMR device 1 first a modulus spectrum Md (or a power spectrum (not shown)) is determined by the processing means 16, using the programmed means stored in the memory 19. By oversampling in the detector it is ensured that no resonance peaks occur at the edges of the spectrum. Subsequently, the programmed means determine parameters of the peaks in the modulus spectrum Md. The programmed means comprise discrimination means for discriminating resonance peaks below a level L (are not taken into account any further). In the present example, only the modulus peaks at $\omega_2$ and $\omega_3$ will be taken into account for forming a model of the spectrum. The peak parameters are, for example peak amplitude, peak width at half amplitude and peak position. In the modulus spectrum, $Md_2$, $HW_2$ and $\omega_2$ are the respective parameters of the peak $P_2$, and $Md_3$, $HW_3$ and $\omega_3$ are the respective parameters of the peak $P_3$. Using the peak parameters stored in the memory 19 after determination, the programmed means determine a model mv of the absorption component of the spectrum (and/or of the dispersion component (not shown). A model of the peak $P_2$ is formed by the absorption line $a_2$ and a model of the peak $P_3$ is formed by the absorption line $a_3$. The parametric description of the lines $a_2$ and $a_3$ (and associated dispersion lines) complies with a Lorentzian line. The model mv of the complex spectrum does not exhibit phase errors. The method in accordance with the invention does not necessitate a very accurate formation of the model. A variation of the formation of the model is indicated, by way of example, in the model mv by way of a broken line with $a_2'$ and $a_3'$. No peaks occur at the edges of the spectrum; the edges are indicated with the frequency ranges $\omega_4$ to $\omega_5$ and $\omega_6$ to $\omega_7$. The bandwidth upon sampling is then $\omega_7-\omega_4$ and the bandwidth after digital filtering is $\omega_6-\omega_5$. When the model has been determined, a given (known) phase shift is imparted to the model across the frequency range in accordance with a frequency-dependent phase function (for example, linearly or according to a polynomial). When the phase of the measured spectrum ($\psi[\omega]=\text{arctg}(\text{Im}/\text{Re})$) approximately corresponds to the phase distortion deliberately introduced into the model at the edges $\omega_4$ to $\omega_5$ and $\omega_6$ to $\omega_7$ in accordance with a predetermined criterion (for example, least-squares optimization procedure), the deliberately introduced phase distortion (represented in the phase function whose coefficients vary upon fitting to the measured phase) can be used for correcting the complex spectrum containing phase errors after the completion of the fitting procedure. The above outlined method will be described hereinafter with more mathematical detail. After Fourier transform of the two digital signals 17 peakparameters $\omega_i$=the frequency in a peak location, $\tau_i=\sqrt{3}/(\pi \cdot H\omega_i)$ and $A_i=Md_i/\tau$ are determined and a model S is determined from the peakparameters:

$$S = {}_iA_i \cdot e^{-t/i} \cdot e^{j(\omega it + \Psi it)},$$

wherein $\Psi_i$ has to be determined according to the invention. $\Psi_i$ is given an initial value before starting the iterative procedures according to the invention. The model S is Fourier transformed to a complex simulated frequency spectrum FT(S) of which the phase at the edges is determined. The $\Psi_i$ are determined from the phase distortion $\Psi[\omega]$, wherein e.g. $\Psi[\omega]=c_0+c_1+\cdot\omega c_2\cdot\omega^2$, wherein $c_0$, $c_1$ and $c_2$ are constants which are determined iteratively with the least squares fit procedure such that the phase at the edges in the model are at least approximately equal to the measured phase=arctg(Im/Ra) determined from the Fourier transformed signal. The values of the constants $c_0$, $c_1$ and $c_2$ in the last iterative step determine $\Psi[\omega]$. After completion of the fitting procedure, the programmed means then also correct, for example point-wise, the complex spectrum (absorption component and/or dispersion component) according to the formules stored in the programmed means:

$$Re'[\omega]=Re[\omega]\cdot\cos(\Psi[\omega])+Im[\omega]\cdot\sin(\Psi[\omega])$$

and $Im'[\omega]=-Re[\omega]\cdot\sin(\Psi[\omega])+Im[\omega]\cdot\cos(\Psi[\omega])$ where $Re'[\omega]$ is the desired absorption component and $Im'[\omega]$ is the dispersion component. $\Psi[\omega]$ is the phase distortion introduced in the model mv. Using the frequency-dependent phase function determined, the above correction can alternatively be performed, only in peak locations and a different strategy may be followed for intermediate points. In an intermediate point in the model the contribution of various peaks is calculated and the phase is corrected thereby in a weighted fashion. For example, when a peak contribution of a first peak amounts to 80% and that of a second peak amounts to 20%, phase correction takes place in the intermediate point with 80% of the phase according to the frequency-dependent phase function determined in the first peak and with 20% of the phase according to the frequency-dependent phase function determined in the second peak.

Not all nuclear spins in the object need be excited. For example, a part of the object (volume of interest) can be excited in order to display a corrected spectrum thereof. In that case so-called volume-selective excitation takes place. This is realized by exciting the gradient coils 5 ($G_x$, $G_y$ and $G_z$) in a given sequence by means of the gradient coil control device 12 and by transmitting an RF electromagnetic pulse by means of the transmitter coil 7. For a detailed description of volume-selective excitation reference is made to, for example an article by Luyten and Den Hollander, "$^1$H MR Spatially Resolved Spectroscopy", Magnetic Resonance Imaging, Vol. 4, pp. 237–239, 1986. Evidently, the described method is not restricted to proton spectra for example, $^{13}C$, $^{31}P$ etc. spectra, high-resolution spectra etc. can also be corrected. Spectra of organic and/or anorganic materials can be corrected. The method can be combined with many known NMR pulse sequences for spectroscopy.

What is claimed is:

1. A method of correcting the phase of a complex magnetic resonance spectrum obtained, using Fourier transformation, from sampling values of at least one resonance signal, which resonance signals are generated by means of RF electromagnetic pulses in an object which is situated in a steady, uniform magnetic field, a model of the complex magnetic resonance spectrum being formed by means of the magnetic resonance spectrum obtained, the phase being corrected on the basis of the model, characterized in that the model is formed by means of at least one peak of a modulus spectrum or of a power spectrum, which modulus spectrum or power spectrum is determined from the complex magnetic resonance spectrum, for the determination of coefficients of a frequency-dependent phase function which extends across the complex spectrum a given phase shift being step-wise imparted to the model until the phase at edges of the complex spectrum approximates the phase at the edges of the model in accordance with a predetermined criterion, after which the phase of the complex spectrum is corrected by means of the frequency-dependent phase function determined.

2. The method as claimed in claim 1, characterized in that from the peaks of the modulus spectrum or power spectrum there are determined peak parameters wherefrom Lorentzian lines for the model are construed.

3. The method as claimed in claim 2, characterized in that the peak parameters are peak amplitude, peak width at half amplitude and peak position.

4. The method as claimed in claim 1, 2 or 3, characterized in that the frequency-dependent phase function is a polynomial.

5. The method as claimed in claim 1, 2 or 3, characterized in that the predetermined criterion is at least-squares criterion.

6. A device for determining a complex magnetic resonance spectrum of at least a part of an object, which device comprises means for generating a steady magnetic field, means for applying magnetic field gradients on the steady, uniform magnetic field, means for transmitting RF electromagnetic pulses in order to generate resonance signals in the object, means for receiving and detecting the resonance signals generated, and means for generating sampling values from the detected resonance signals, and also comprises programmed means for determining, using Fourier transformation the complex magnetic resonance spectrum from the sampling values, which programmed means are also suitable for determining a model from the complex magnetic resonance spectrum, characterized in that the programmed means are also suitable for determining a modulus spectrum or power spectrum from the complex spectrum, for forming the model from at least one peak of the modulus spectrum or power spectrum, for step-wise imparting a phase shift to the model in order to determine coefficients of a frequency-dependent phase function which extends across the complex spectrum until the phase at edges of the model approximates the phase at edges of the complex spectrum in accordance with a predetermined criterion, and for correcting the phase of the complex spectrum by means of the frequency-dependent phase function determined.

7. The method as claimed in claim 4 characterized in that the predetermined criterion is a least-squares criterion.

8. The device as claimed in claim 6, characterized in that from the peaks of the modulus spectrum or power spectrum there are determined peak parameters wherefrom Lorentzian lines for the model are construed.

9. The device as claimed in claim 8, characterized in that the peak parameters are peak amplitude, peak width at half amplitude and peak position.

10. The device as claimed in claim 6, 8 or 9, characterized that the frequency dependent phase function is a polynonial.

11. The device as claimed in claim 6, 8 or 9, characterized in that the predetermined criterion is a least-squares criterion.

12. The device as claimed in claim 10, characterized that the predetermined criterion is a least-square criterion.

* * * * *